US012727446B2

(12) United States Patent
Lin et al.

(10) Patent No.: US 12,727,446 B2
(45) Date of Patent: Sep. 1, 2026

(54) SEMICONDUCTOR DEVICE WITH GETTERING SITES AND METHOD OF MANUFACTURING THE SAME

(71) Applicant: Vanguard International Semiconductor Corporation, Hsinchu (TW)

(72) Inventors: Chrong-Jung Lin, Hsinchu (TW); Chia-Shen Liu, Hsinchu (TW); Wen-Hua Wen, Taoyuan (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 657 days.

(21) Appl. No.: 17/951,135

(22) Filed: Sep. 23, 2022

(65) Prior Publication Data

US 2024/0105504 A1 Mar. 28, 2024

(51) Int. Cl.

*H10P 90/00* (2026.01)
*H10D 86/00* (2025.01)
*H10P 30/20* (2026.01)
*H10P 30/22* (2026.01)
*H10P 50/24* (2026.01)
*H10W 10/00* (2026.01)

(Continued)

(52) U.S. Cl.

CPC ....... *H10P 90/1906* (2026.01); *H10D 86/201* (2025.01); *H10P 30/204* (2026.01); *H10P 30/22* (2026.01); *H10W 10/014* (2026.01); *H10W 10/061* (2026.01); *H10W 10/17* (2026.01); *H10W 10/181* (2026.01); *H10P 30/21* (2026.01); *H10P 50/242* (2026.01)

(58) Field of Classification Search

CPC ............. H01L 21/76283; H01L 21/266; H01L 21/26513; H01L 21/3065; H10D 86/201

See application file for complete search history.

(56) References Cited

U.S. PATENT DOCUMENTS 5,561,073 A * 10/1996 Jerome ................ H10D 84/645 257/E21.372
6,541,348 B1 * 4/2003 Nakajima ........... H01L 21/3226 257/E21.32

(Continued)

FOREIGN PATENT DOCUMENTS

CN 102157431 A * 8/2011 ....... H01L 21/76232
CN 107611169 B * 9/2024

*Primary Examiner* — Eliseo Ramos Feliciano
*Assistant Examiner* — Timothy Edward Duren
(74) *Attorney, Agent, or Firm* — Winston Hsu

(57) ABSTRACT

A semiconductor device includes an insulating base layer, a semiconductor layer, an insulating layer, an isolation trench and a gettering site. The semiconductor layer and the insulating layer are disposed on the insulating base layer in sequence, and the isolation trench is disposed in the semiconductor layer and passes through the insulating layer. The isolation trench includes a first cross-section, a second cross-section and a third cross-section from top to bottom. The first cross-section is higher than the bottom surface of the insulating layer, and the second cross-section and the third cross-section are lower than the bottom surface of the insulating layer. The gettering site is disposed in the semiconductor layer and in contact with the isolation trench, and the vertex of the gettering site is lower than the second cross-section.

20 Claims, 7 Drawing Sheets

(51) Int. Cl.
*H10W 10/10* (2026.01)
*H10W 10/17* (2026.01)

(56) References Cited

U.S. PATENT DOCUMENTS

2008/0001214 A1* 1/2008 Yamaoka ............. H10D 64/027
257/E21.429
2019/0237495 A1* 8/2019 Shoyama .............. H10F 39/014

* cited by examiner

SEMICONDUCTOR DEVICE WITH GETTERING SITES AND METHOD OF MANUFACTURING THE SAME

BACKGROUND OF THE INVENTION

1. Field of the Invention

The present disclosure relates to a semiconductor device, and more particularly to a semiconductor device having gettering sites and a method of manufacturing the same.

2. Description of the Prior Art

A semiconductor device, such as a transistor, in an integrated circuit is usually manufactured in a semiconductor substrate, and the manufacturing method of a semiconductor device usually includes performing multiple semiconductor processes such as doping, thin film deposition, and epitaxial growth. The semiconductor substrate inevitably contains impurity atoms, and during the above semiconductor processes, impurity atoms such as conductive atoms (e.g., copper, iron and/or gold) may be further generated in the semiconductor substrate. When impurity atoms exist in the semiconductor substrate, it not only increases the leakage current (e.g., junction leakage current) of the semiconductor device, but also reduces the breakdown voltage of the semiconductor device, thus deteriorating the electrical performance of the semiconductor device.

In order to remove the impurity atoms in the semiconductor substrate, a gettering site is generally disposed in the semiconductor substrate for trapping the impurity atoms in the semiconductor substrate. However, the gettering site is generally formed in a bulk semiconductor rather than a semiconductor-on-insulator (SOI) substrate. Therefore, for the semiconductor device fabricated on the SOI substrate, it is still necessary to further improve the gettering site of the semiconductor device and its manufacturing method.

SUMMARY OF THE INVENTION

In view of this, it is necessary to provide a modified semiconductor device to overcome the shortcomings of conventional semiconductor devices.

A semiconductor device includes an insulating base layer, a semiconductor layer, insulating layers, isolation trenches and gettering sites. The semiconductor layer is disposed on the insulating base layer, and the insulating layers are disposed on the semiconductor layer. The isolation trenches are disposed in the semiconductor layer and pass through the insulating layer. The isolation trench includes a first cross-section, a second cross-section and a third cross-section from top to bottom, where the first cross-section is higher than the bottom surface of the insulating layer, and the second cross-section and the third cross-section are lower than the bottom surface of the insulating layer. The gettering sites are disposed in the semiconductor layer and respectively contact the isolation trenches, and the vertex of each gettering site is lower than the second cross-section.

A method of manufacturing a semiconductor device includes following steps. A substrate is provided, wherein an insulating base layer and a semiconductor layer are sequentially disposed on the substrate. An insulating layer is formed on the semiconductor layer, wherein the insulating layer includes a bottom surface. Isolation trenches are formed in the semiconductor layer and the insulating layer to expose the insulating base layer. The steps of forming the isolation trench include: etching the insulating layer to form an upper through hole in the insulating layer; and etching the semiconductor layer to form a lower through hole in the semiconductor layer after etching the insulating layer, wherein the lower portion of the lower through hole includes a tapered portion, and an etching inhibitor is concurrently formed during etching the semiconductor layer, and the etching inhibitor covers the inner sidewall of the upper through hole. After the isolation trench is formed, the insulating layer is used as an ion implantation mask to form a gettering site, wherein the gettering site contacts the isolation trench, and the vertex of the gettering site is lower than the bottom surface of the insulating layer. An insulating material is formed in the isolation trench.

According to an embodiment of the present disclosure, since the vertex of the gettering site is lower than the bottom surface of the insulating layer, the gettering site is farther away from the upper portion of the semiconductor layer so that the negative impact on the electric field distribution in the upper portion of the semiconductor layer generated by the lattice defects of the gettering site is prevented, or the impurity atoms in the gettering site attracted by the electric field thus spreading outwards to the upper portion of the semiconductor layer is prevented. Therefore, the electrical performance of the semiconductor device is increased.

In addition, since each of the isolation trenches includes the first cross-section, the second cross-section, and the third cross-section from top to bottom, when the width of the first cross-section and the width of the third cross-section are smaller than the width of the second cross-section, it is more advantageous for forming the gettering site only at the lower periphery of the isolation trench rather than at the upper periphery of the isolation trench during forming the gettering site.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
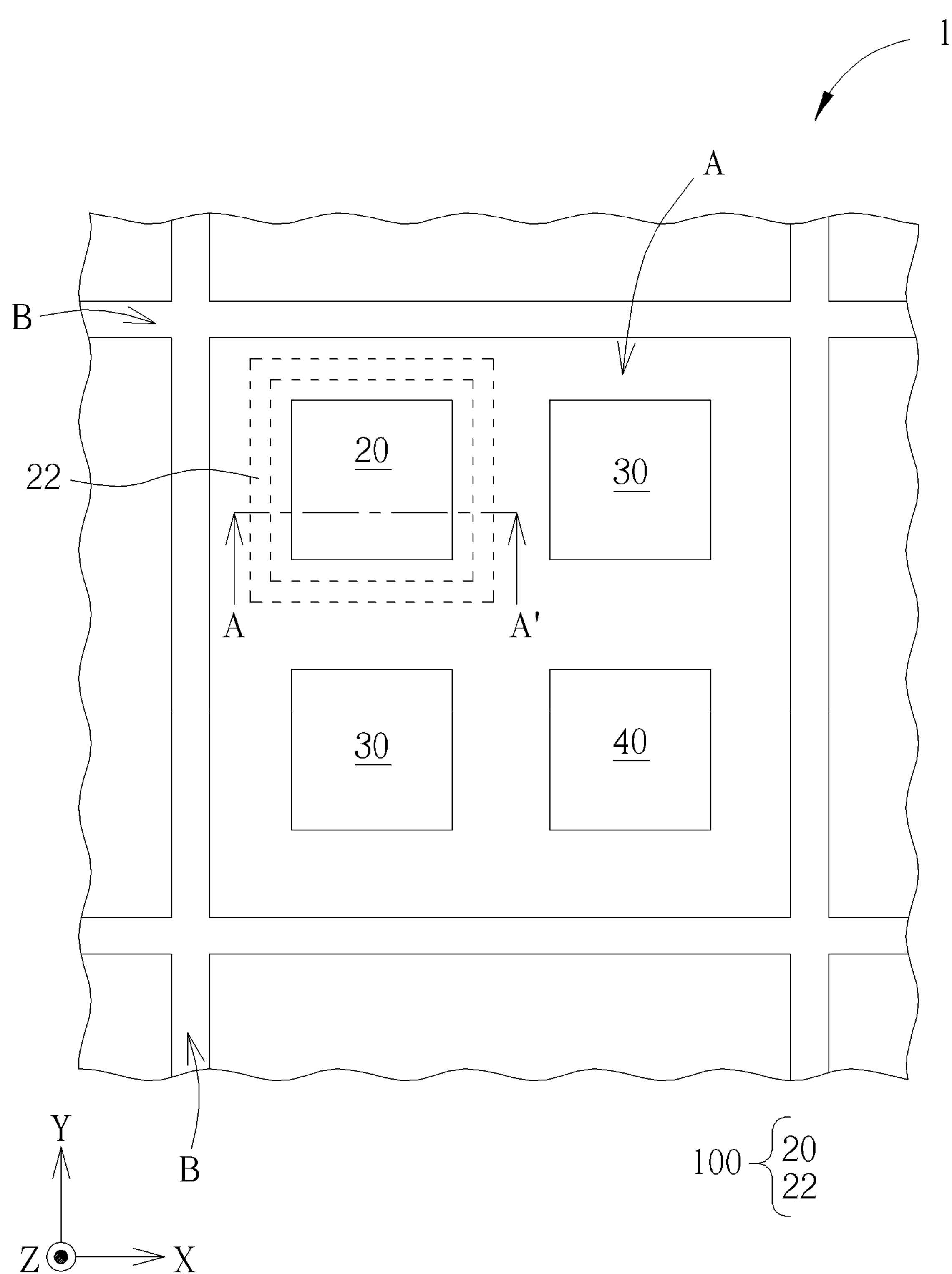
FIG. 1 is a schematic top view of a chip structure according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “under,” “lower,” “over,” “above,” “on,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. For example, if the device in the figures is turned over, elements described as “below” and/or “beneath” other elements or features would then be oriented “above” and/or “over” the other elements or features. The apparatus may be otherwise oriented (rotated 90 degrees or at other orientations) and the spatially relative descriptors used herein may likewise be interpreted accordingly.

It is understood that, although the terms first, second, third, etc. may be used herein to describe various elements, components, regions, layers and/or sections, these elements, components, regions, layers and/or sections should not be limited by these terms. These terms may be only used to distinguish one element, component, region, layer and/or section from another region, layer and/or section. Terms such as “first,” “second,” and other numerical terms when used herein do not imply a sequence or order unless clearly indicated by the context. Thus, a first element, component, region, layer and/or section discussed below could be termed a second element, component, region, layer and/or section without departing from the teachings of the embodiments.

As disclosed herein, the term “about” or “substantial” generally means within 20%, 10%, 5%, 3%, 2%, 1%, or 0.5% of a given value or range. Unless otherwise expressly specified, all of the numerical ranges, amounts, values and percentages disclosed herein should be understood as modified in all instances by the term “about” or “substantial”. Accordingly, unless indicated to the contrary, the numerical parameters set forth in the present disclosure and attached claims are approximations that can vary as desired.

Furthermore, as disclosed herein, the terms “coupled to” and “electrically connected to” include any directly and indirectly electrical connecting means. Therefore, if it is described in this document that a first component is coupled or electrically connected to a second component, it means that the first component may be directly connected to the second component, or may be indirectly connected to the second component through other components or other connecting means.

Although the disclosure is described with respect to specific embodiments, the principles of the disclosure, as defined by the claims appended herein, can obviously be applied beyond the specifically described embodiments of the disclosure described herein. Moreover, in the description of the present disclosure, certain details have been left out in order to not obscure the inventive aspects of the disclosure. The details left out are within the knowledge of a person having ordinary skill in the art.

FIG. 1 is a schematic top view of a chip structure according to an embodiment of the present disclosure. Referring to FIG. 1, the chip structure 1 may be disposed in a chip region A of the wafer, and the periphery of the chip region A may be surrounded by a scribe line region B. In the subsequent process, the adjacent chip regions A may be separated from each other by dicing along the scribe line region B. The chip region A may include an integrated circuit, and the integrated circuit includes a plurality of semiconductor device regions such as semiconductor device regions 20, 30, and 40 for accommodating power transistors, logic operation devices, or memory devices respectively, but not limited thereto. For a semiconductor device 100 in the chip region A, the semiconductor device 100 includes the semiconductor device region 20 and an isolation region 22. The isolation region 22, for example, includes a deep trench isolation structure, which may surround the periphery of the semiconductor device region 20 to electrically insulate the semiconductor device region 20 from other semiconductor device regions 30, 40 or other regions in the chip region A.

Figure 2:
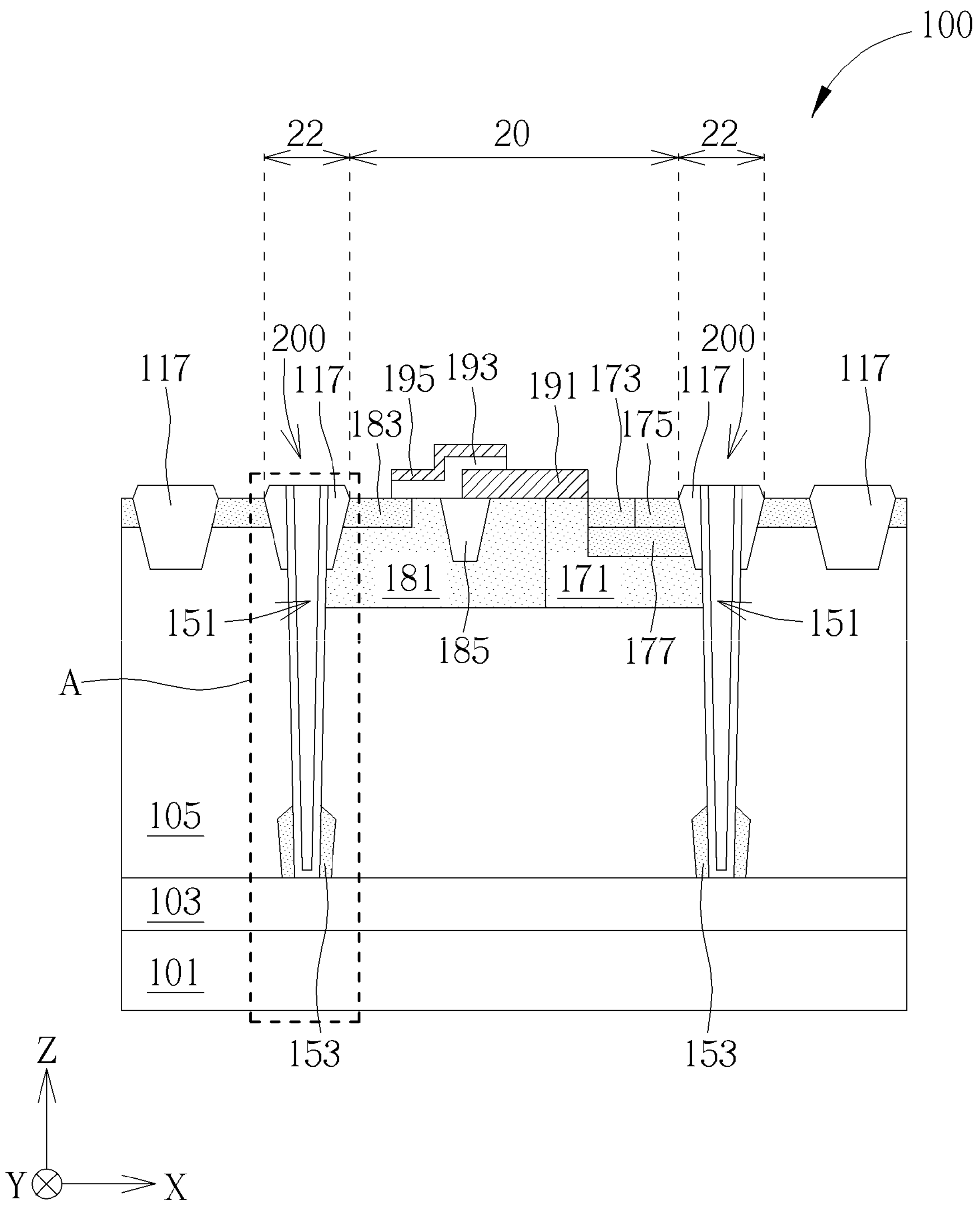
FIG. 2 is a schematic cross-sectional view taken along line A-A' of FIG. 1 according to an embodiment of the present disclosure.

FIG. 2 is a schematic cross-sectional view taken along line A-A' of FIG. 1 according to an embodiment of the present disclosure. Referring to FIG. 2, the semiconductor device 100 includes at least a substrate 101, an insulating base layer 103, a semiconductor layer 105, at least two insulating layers 117, at least two isolation trenches 151, and at least two gettering sites 153. The substrate 101 may be a semiconductor substrate, an insulating substrate, or other suitable handle substrate. According to an embodiment of the present disclosure, the substrate 101 may be removed to thereby expose the bottom surface of the insulating base layer 103. The insulating base layer 103 (e.g., buried insulating layer) is disposed on the substrate 101, and the composition thereof includes, for example, silicon oxide, other silicon-containing oxide, or other suitable insulating materials. By providing the insulating base layer 103, leakage current is prevented from flowing from the substrate 101 to the layer disposed above the insulating base layer 103. The semiconductor layer 105 is disposed on the insulating base layer 103, and the composition thereof includes, for example, silicon semiconductor (e.g., single crystal silicon) or compound semiconductor (e.g., gallium nitride or silicon carbide). The insulating layer 117 (e.g., shallow trench isolation structure) is disposed on the semiconductor layer 105, and the insulating layer 117 includes a bottom surface buried in the semiconductor layer 105. The isolation trench 151 is disposed in the semiconductor layer 105 and passes through some insulating layers 117. The isolation trench 151 may be filled with insulating material so that the isolation trench 151 and the penetrated insulating layer 117 may be part of a deep trench isolation structure 200. By providing the insulating base layer 103 and the deep trench isolation structure 200, the semiconductor component region 20 is electrically insulated from the external region.

The gettering sites 153 are disposed in the semiconductor layer 105 and contact the isolation trenches 151. The gettering sites 153 are located between the isolation trenches 151 and are laterally (e.g., in an X direction) separated from each other. The gettering site 153 is, for example, a doped region (e.g., an arsenic doped region or other suitable doped regions) which is used to trap impurity atoms such as conductive atoms (e.g., copper, iron and/or gold) in the semiconductor layer 105 so as to prevent the impurity atoms from negatively affecting the electrical performance of the semiconductor device 100. According to an embodiment of the present disclosure, the gettering site 153 itself has conductivity, and the gettering site 153 is formed by ion implantation. Therefore, the lattice defects in the gettering site 153 are more than the lattice defects in the adjacent semiconductor layer 105. In addition, since the gettering site 153 is used to trap impurity atoms in the semiconductor layer 105, when the impurity atoms are trapped in the gettering site 153, the gettering site 153 contains a high concentration of impurity atoms. According to an embodiment of the present disclosure, by placing the gettering site 153 only on the lower periphery of the isolation trench 151 rather than the upper periphery of the isolation trench 151, the gettering site 153 is vertically (e.g., in a Z direction) separated from each of the doped regions located on the upper portion of the semiconductor layer 105 (e.g., a source doped region, a drain doped region, a well region, the base region, a drift region or other doped regions). Thus, current is prevented from flowing through the gettering site 153, or the lattice defects of the gettering site 153 is prevented from negatively affecting the electric field distribution in each doped region, or the impurity atoms trapped in the gettering site 153 are prevented from being attracted by the electric field and diffusing outwards to the doped region. Therefore, the electrical performance of the semiconductor device is improved.

According to an embodiment of the present disclosure, in addition to the above components, the semiconductor device 100 may include other components such as doped regions, insulating structures and electrode structures. As shown in FIG. 2, the semiconductor device 100 includes a well region 171 with a first conductivity type (e.g., P type) which is disposed in the upper portion of the semiconductor layer 105 and located on one side of the semiconductor device region 20. Source doped region 173 and heavily doped region 175 have a second conductivity type (e.g., N type) and the first conductivity type respectively, and are disposed in the well region 171. The body doped region 177 which has the first conductivity type is disposed in the well region 171 and abutting the source doped region 173 and the heavily doped region 175. A drift region 181 which has the second conductivity type is disposed in the upper portion of the semiconductor layer 105 and at another side of the semiconductor device region 20. A drain doped region 183 which has the second conductivity type is disposed in the drift region 181. An insulating structure 185 is disposed in the drift region 181 to increase the transmission path of current in the drift region 181. A gate structure 191 is disposed on the semiconductor layer 105 and spans the junction between the well region 171 and the drift region 181. The upper portion of part of the well region 171 is abutting and overlapped with the bottom surface of the gate structure 191, and serves as the channel region of the semiconductor device 100. A dielectric layer 193 and a field plate 195 are sequentially disposed on the drift region 181, and partially overlapped with the gate structure 191. During the operation of the semiconductor device 100, the electric field distribution in the drift region 181 is controlled by applying a bias voltage to the field plate 195.

Figure 3:
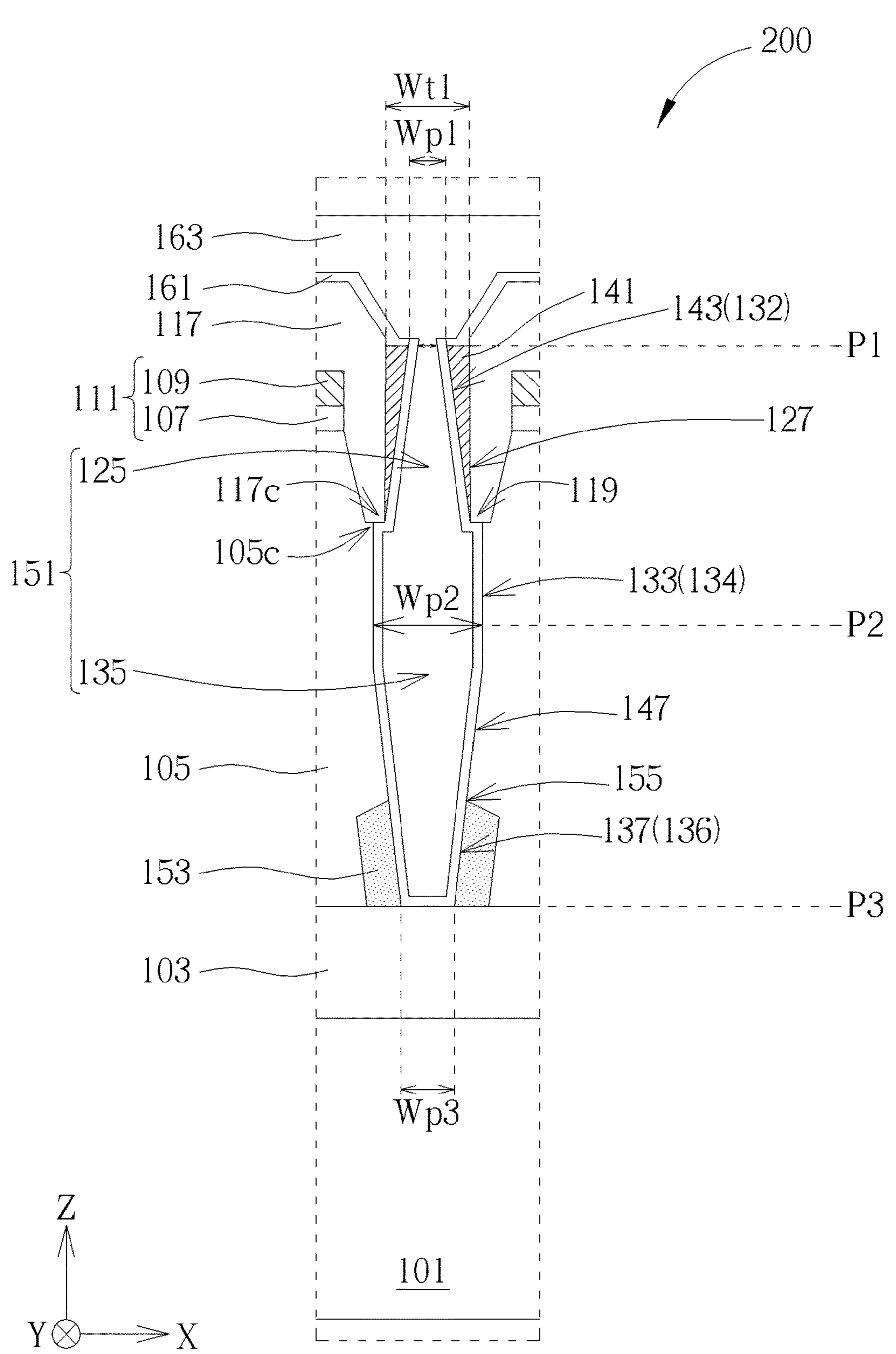
FIG. 3 is an enlarged schematic cross-sectional view of a partial region of the semiconductor device of FIG. 1.

FIG. 3 is an enlarged schematic cross-sectional view of a partial region of the semiconductor device of FIG. 1. Referring to FIG. 3, the deep trench isolation structure 200 is disposed on the insulating base layer 103 and includes the isolation trench 151. The isolation trench 151 includes an upper trench 125 and a lower trench 135. The upper trench 125 is disposed in an upper through hole 127, wherein the upper through hole 127 is a hole passing through the insulating layer 117. The lower trench 135 is coincident with a lower through hole 147, wherein the lower through hole 147 is a hole passing through the semiconductor layer 105 and exposes the top surface of the insulating base layer 103.

An etching inhibitor 141 covers the inner sidewall of the upper through hole 127 so that the inner sidewall 143 of the etching inhibitor 141 is coincident with the inner sidewall 132 of the upper trench 125. The composition of the etching inhibitor 141 includes, for example, a polymer (e.g., fluorine-containing polymer) or oxide (e.g., silicon-containing oxide), which may be a solid product formed during the plasma etching process for forming the isolation trench 151. According to an embodiment of the present disclosure, the etching inhibitor 141 is not limited to covering only the inner sidewall of the upper through hole 127, but further covering the partial inner sidewall of the lower through hole 147 so that the partial inner sidewall of the etching inhibitor 141 is coincident with the partial inner sidewall of the lower trench 135. According to an embodiment of the present disclosure, the etching inhibitor 141 has an inclined surface, and the width of the opening defined by the etching inhibitor 141 gradually increases from top to bottom. However, according to other embodiments, the cross-sectional profile of the etching inhibitor 141 along the vertical direction (e.g., in a Z direction) may also include a vertical surface or a curved surface, and the narrowest portion of the opening width thereof is not limited to the top portion thereof, but may be the middle portion thereof or bottom portion thereof.

As for the isolation trench 151, the isolation trench 151 may include a plurality of trench cross-sections such as a first cross-section P1, a second cross-section P2, and a third cross-section P3 from top to bottom. The first cross-section P1 is higher than the bottom surface 119 of the insulating layer 117, and is defined between two opposite etching inhibitors 141, which has a width Wp1. The second cross-section P2 is lower than the bottom surface 119 of the insulating layer 117, and is located in the lower trench 135 of the isolation trench 151 (e.g., in an expanded portion 133 of the lower trench 135), which has a width Wp2. The third section P3 is lower than the bottom surface 119 of the insulating layer 117, and is located in the lower trench 135 of the isolation trench 151 (e.g., in a tapered portion 137 of the lower trench 135), which has a width Wp3. The relationship among the widths Wp1, Wp2 and Wp3 satisfies the following relations (1) and (2):

$$Wp1<Wp2 \tag{1}$$

$$Wp3<Wp2 \tag{2}$$

In addition, the upper through hole 127 in the insulating layer 117 may have a width Wt1, and the width relationship between the upper through hole 127 and the third cross-section P3 of the isolation trench 151 satisfies the following relation (3):

$$Wt1>Wp3 \tag{3}$$

As for the expanded portion 133 of the lower trench 135, a portion of the partial inner sidewall 134 expands outward so that the width of this portion is wider than the width Wt1 of the upper through hole 127, and the cross-sectional profile of the expanded portion 133 in the vertical direction (e.g., in a Z direction) may include an inclined surface or a curved surface. In addition, as for the topmost end of the expanded portion 133, the topmost end is abutting the bottom corner 117*c* of the insulating layer 117 and the top corner 105*c* of the semiconductor layer 105, and the bottom corner 117*c* of the insulating layer 117 and the top corner 105*c* of the semiconductor layer 105 are laterally (e.g., in an X direction) separated from each other because of the outward expansion of the inner sidewall 134 of the expanded portion 133.

As for the tapered portion 137 of the lower trench 135, the tapered portion 137 is located below the expanded portion 133, but it is not limited to being abutting the expanded portion 133, and the inner sidewall 136 of the tapered portion 137 tapers from top to bottom so as to have an inclined surface or a curved surface.

According to an embodiment of the present disclosure, the width of any cross-section of the expanded portion 133 is larger than the width Wt1 of the upper through hole 127, while the width of some cross-sections of the tapered portion 137 is smaller than the width Wt1 of the upper through hole 127. In addition, the lower trench 135 includes not only the expanded portion 133 and the tapered portion 137 but also other portions such as a vertical portion or a curved portion.

The gettering site 153 contacts a portion of the isolation trench, and is disposed along the inner sidewall 136 of the tapered portion 137 of the lower trench 135, and directly contacts the insulating base layer 103. The vertex 155 of the gettering site 153 is lower than the second cross-section P2, so the gettering site 153 is vertically (e.g., in a Z direction) separated from the expanded portion 133 of the lower trench 135.

An insulating material may be disposed in the isolation trench 151 of the deep trench isolation structure 200 to increase the electrical isolation capability of the deep trench isolation structure 200. According to an embodiment of the present disclosure, the isolation trench 151 may include an insulating material 161 and a filling material 163, wherein the insulating material 161 may conformally cover the inner sidewalls 132, 134, 136 of the isolation trench 151, and the filling material 163 may be filled into the isolation trench 151. The composition of the filling material 163 may be an insulating material or a conductive material depending on actual requirement. According to an embodiment of the present disclosure, the isolation trench 151 may not have the conformal insulating material 161 so that the filling material 163 directly contacts the inner sidewalls 132, 134, 136 of the isolation trench 151, and the composition of the filling material 163 may be an insulating material in this case.

According to an embodiment of the present disclosure, in order to protect the surface of the semiconductor layer 105, a pad layer 111, such as an oxide pad layer 107 and a nitride pad layer 109, may be further disposed between the semiconductor layer 105 and the insulating layer 117, but not limited thereto.

In order to enable one person having ordinary skill in the art to realize the semiconductor device of the present disclosure, the method of manufacturing the semiconductor device of the present disclosure is further described below.

Figures 4, 5:
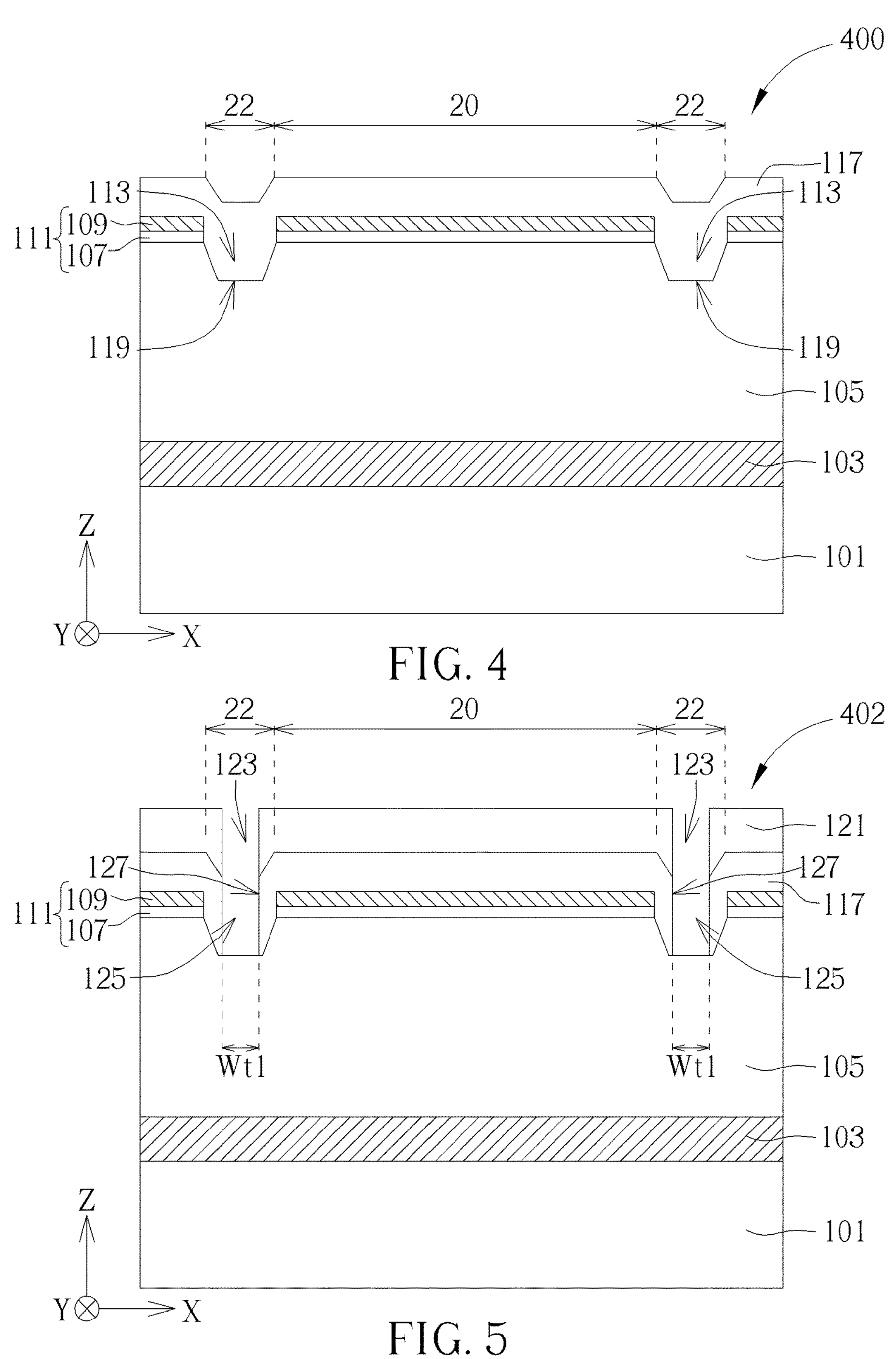
FIG. 4 to FIG. 10 are schematic cross-sectional views of a method for manufacturing a semiconductor device at various stages according to an embodiment of the present disclosure.

FIG. 4 is a schematic cross-sectional view of a method for manufacturing a semiconductor device at various stages according to an embodiment of the present disclosure. Referring to a cross-section 400 of FIG. 4, a substrate 101 is provided, and an insulating base layer 103 and a semiconductor layer 105 are sequentially disposed. The insulating base layer 103 may be a bonding layer so that the semiconductor layer 105 may be bonded to the substrate 101 by a bonding process. The surface of the semiconductor layer 105 is provided with a pad layer 111 including an oxide pad layer 107 and a nitride pad layer 109, but not limited thereto. When the composition of the semiconductor layer 105 is monocrystalline silicon, the composition of the oxide pad layer 107 may contain silicon oxide, and the composition of the nitride pad layer 109 may contain silicon nitride. An opening may be formed in the pad layer 111, and the pad layer 111 is used as an etching mask to form at least two recessed regions 113 on the surface of the semiconductor layer 105, and the bottom of the recessed regions 113 is vertically separated from the insulating base layer 103.

Then, an insulating layer 117 is deposited so that the insulating layer 117 covers the pad layer 111 and fills into the recessed region 113. In order to fully fill the recessed region 113 with the insulating layer 117, a high density plasma chemical vapor deposition (HDPCVD) or other suitable plasma enhanced chemical vapor deposition (PECVD) process may be performed to form the insulating layer 117. At this stage, the insulating layer 117 filled in the recessed region 113 has a bottom surface 119 which is separated from the insulating base layer 103 in the vertical direction (e.g., in a Z direction).

In the subsequent process, at least one isolation trench may be further formed in the insulating layer 117 and the semiconductor layer 105 to expose the insulating base layer 103. The processes of forming the isolation trench are shown in FIG. 5 to FIG. 7.

FIG. 5 is a schematic cross-sectional view of a method for manufacturing a semiconductor device at a fabrication stage according to an embodiment of the present disclosure. Referring to a cross-section 402 of FIG. 5, an etching mask 121 (e.g., photoresist) is formed, and the etching mask 121 has an opening 123 therein. Then, the insulating layer 117 exposed form the opening 123 is etched to form an upper through hole 127 in the insulating layer 117. The bottom surface of the upper through hole 127 includes a width Wt1, and the width Wt1 is smaller than the width of the bottom surface of the recessed region 113. At this stage, the upper through hole 127 is coincident with the upper trench 125, and in the subsequent process, the upper trench 125 can constitute the upper portion of the isolation trench.

Figures 6, 7:
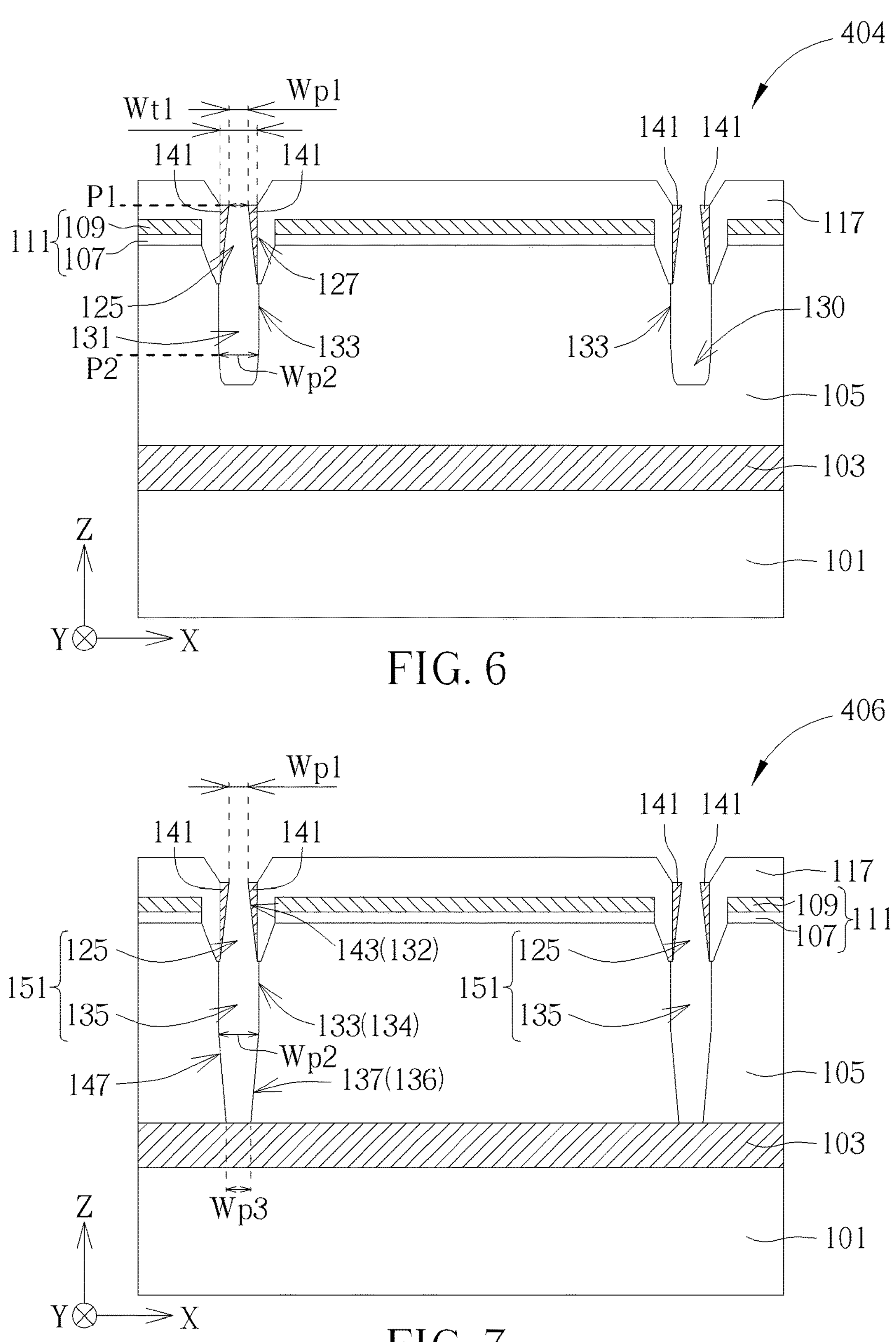

FIG. 6 is a schematic cross-sectional view of a method for manufacturing a semiconductor device at a fabrication stage according to an embodiment of the present disclosure. After the insulating layer 117 is etched to form the upper through hole 127, the semiconductor layer 105 is etched (e.g., plasma etching process or other suitable etching process) with the insulating layer 117 as an etching mask to form a temporary trench 131 in the semiconductor layer 105 as shown in the cross-section 404 of FIG. 6. In the process of etching the semiconductor layer 105, an etching inhibitor 141 is formed concurrently, and the etching inhibitor 141 covers the inner sidewall of the upper through hole 127. In addition, the thickness of the etching inhibitor 141 is not fixed but continuously changes (e.g., gradually thickening) during the process of etching the semiconductor layer 105. According to an embodiment of the present disclosure, a deep reactive ion etching (DRIE) process is used to form the temporary trench 131. As solid product (e.g., fluorine-containing polymer, other polymer, silicon-containing oxide or other oxide) generated by the deep reactive ion etching process is deposited on the inner sidewall of the upper through hole 127, the width Wp1 is defined by the first cross-section P1 of the upper trench 125 between two opposite etching inhibitors 141, and the width Wp1 is smaller than the width Wt1 of the upper through hole 127. According to an embodiment of the present disclosure, at this stage, the etching inhibitor 141 has an inclined surface, and the defined opening width gradually increases from top to bottom. However, according to other embodiments, the cross-sectional profile of the etching inhibitor 141 in the vertical direction (e.g., in a Z direction) may also include a vertical surface or a curved surface, and the narrowest portion of the opening width is not limited to the top portion thereof, but may be middle portion thereof or bottom portion thereof.

As for the temporary trench 131, it includes an expanded portion 133. In the expanded portion 133, the width Wp2 of the second cross-section P2 is wider than the width Wt1 of the upper through hole 127, and wider than the width Wp1 of the first cross-section P1 of the upper trench 125.

FIG. 7 is a schematic cross-sectional view of a method for manufacturing a semiconductor device at a fabrication stage according to an embodiment of the present disclosure. Referring to a cross-section 406 in FIG. 7, the semiconductor layer 105 is subsequently etched (e.g., deep reactive ion etching (DRIE) or other suitable etching process) to form a lower through hole 147 (as known as the lower trench 135) in the semiconductor layer 105 and to expose the insulating base layer 103. The lower through hole 147 includes an expanded portion 133 and a tapered portion 137, and the tapered portion 137 is located below the flared portion 133. The inner sidewall 136 of the tapered portion 137 tapers from top to bottom, and has an inclined surface or a curved surface. The bottom surface of the tapered portion 137 includes a width Wp3, and the width Wp3 is smaller than the width Wp2 of the expanded portion 133. The upper trench 125 and the lower trench 135 may form a portion of the isolation trench 151, the isolation trench 151 includes an inner sidewall 132, an inner sidewall 134, and an inner sidewall 136 from top to bottom, and the inner sidewall 143 of the etching inhibitor 141 is coincident with the inner sidewall 132 of the upper trench 125.

Figures 8, 9:
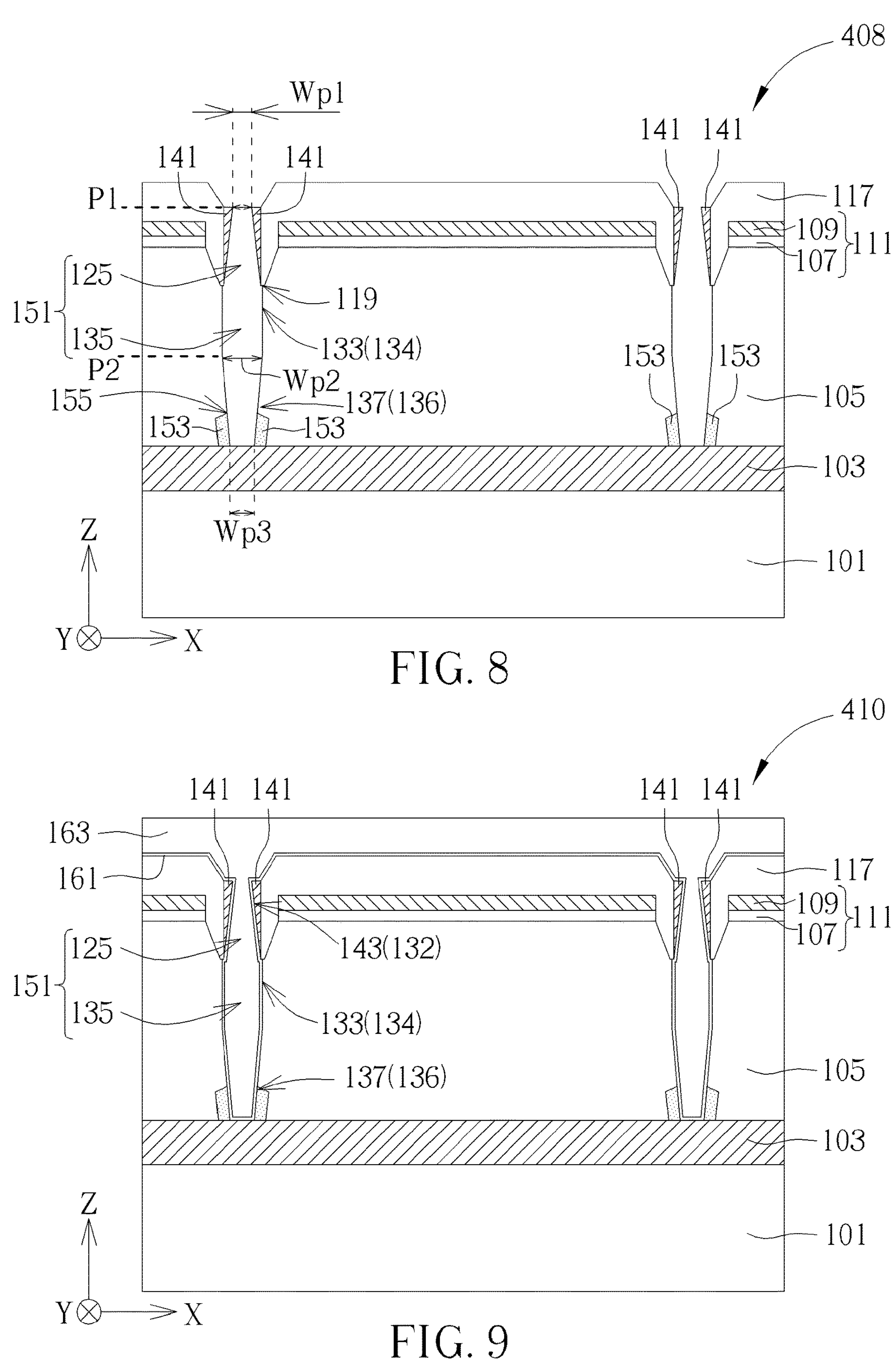

FIG. 8 is a schematic cross-sectional view of a method for manufacturing a semiconductor device at a fabrication stage according to an embodiment of the present disclosure. After the isolation trench 151 is formed, referring to a cross-section 408 of FIG. 8, the insulating layer 117 is used as an ion implantation mask, or the insulating layer 117 and the etching inhibitor 141 are used as ion implantation masks concurrently, and an ion implantation process is performed to form a gettering site 153 contacting the isolation trench 151. Because the relationship between the widths Wp1, Wp2, and Wp3 of the first cross-section P1, the second cross-section P2, and the third cross-section P3 of the isolation trench 151 satisfies the above relations (1) and (2), when the ion implantation process is performed, the gettering site 153 is formed only at the side of the tapered portion 137 rather than at the side of the flared portion 133. Thus, the vertex 155 of the gettering site 153 is lower than the bottom surface 119 of the insulating layer 117.

FIG. 9 is a schematic cross-sectional view of a method for manufacturing a semiconductor device at a fabrication stage according to an embodiment of the present disclosure. After the gettering site 153 is formed, referring to a cross-section 410 of FIG. 9, an insulating material 161 and a filling material 163 are sequentially formed in the isolation trench 151, wherein the insulating material 161 may conformally cover the inner sidewalls 132, 134, 136 of the isolation trench 151, and the filling material 163 may be filled in the isolation trench 151. The composition of the filling material 163 may be an insulating material or a conductive material depending on actual requirement.

Figure 10:
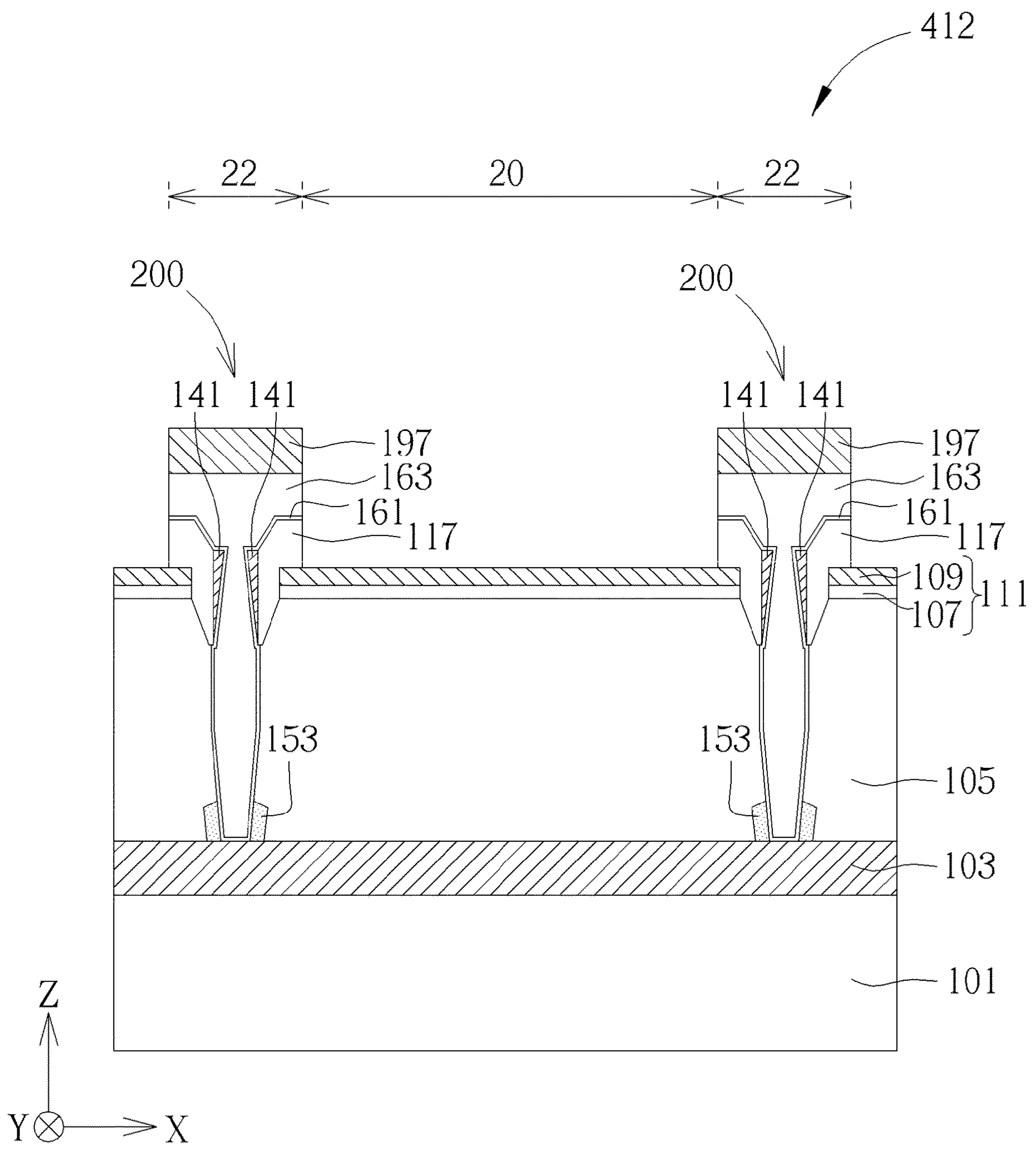

FIG. 10 is a schematic cross-sectional view of a method for manufacturing a semiconductor device at a fabrication stage according to an embodiment of the present disclosure. Referring to a cross-section 412 of FIG. 10, an etching process is performed to remove the filling material 163, the insulating material 161 and the insulating layer 117 not covered by the etching mask 197 until the pad layer 111 is exposed, and a deep trench isolation structure 200 is thereby formed in the isolation region 22. In the subsequent process, a suitable semiconductor process may be performed, for example, doped regions, insulating structures, electrode structures or field plates may be further formed in the semiconductor device region 20 to form a semiconductor device similar to the one shown in FIG. 2. According to an embodiment of the present disclosure, the substrate 101 may be further removed to expose the bottom surface of the insulating base layer 103, but not limited thereto.

According to the above embodiments, since the gettering site 153 in the semiconductor device 100 is provided only at the lower periphery of the isolation trench 151 rather than at the upper periphery of the isolation trench 151, the gettering site 153 is separated from each doped region or each component located at the upper portion of the semiconductor layer 105 in the vertical direction (e.g., in a Z direction). Thus, electric current is prevented from flowing through the gettering site 153, or the lattice defects of the gettering site 153 is prevented from negatively affecting the electric field distribution, or the impurity atoms trapped in the gettering site 153 are prevented from being attracted by the electric field and diffusing outwards to the doped region. Therefore, the electrical performance of the semiconductor device 100 is improved. In addition, since each of the isolation trenches 151 includes the first cross-section P1, the second cross-section P2, and the third cross-section P3 from top to bottom, when the widths Wp1 and Wp3 of the first cross-section P1 and the third cross-section P3 are smaller than the width Wp2 of the second cross-section P2, it is more advantageous for forming the gettering site 153 only at the lower periphery of the isolation trench 151 rather than at the upper periphery of the isolation trench 151 during an ion implantation of forming gettering site 153.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device comprising a semiconductor device region and an isolation region surrounding the semiconductor device region, and the semiconductor device comprising:
- an insulating base layer;
- a semiconductor layer disposed on the insulating base layer;
- a deep trench isolation structure disposed in the isolation region and surrounding the semiconductor device region, wherein the deep trench isolation structure electrically insulates the semiconductor component region from an external region, and the deep trench isolation structure comprises:
  - at least two insulating layers disposed on the semiconductor layer, and each insulating layer comprising a bottom surface; and
  - at least two isolation trenches, each isolation trench being disposed on the semiconductor layer and passing through each insulating layer, wherein each isolation trench comprises a first cross-section, a second cross-section and a third cross-section from top to bottom, the first cross-section is higher than a bottom surface of the insulating layer, and the second cross-section and the third cross-section are lower than the bottom surface of each insulating layer; and
- at least two gettering sites disposed in the semiconductor layer and respectively contacting the isolation trenches, wherein a vertex of each gettering site is lower than the second cross-section, wherein the gettering site is configured to trap impurity atoms in the semiconductor layer to prevent the impurity atoms from negatively affecting an electrical performance of the semiconductor device, and a current is prevented from flowing through the gettering site.

2. The semiconductor device of claim 1, wherein each of the insulating layers comprises a bottom corner laterally separated from a top corner of the semiconductor layer.

3. The semiconductor device of claim 1, wherein each of the isolation trenches passes through the semiconductor layer to expose the insulating base layer.

4. The semiconductor device of claim 1, wherein each of the gettering sites is disposed along an inner sidewall of a lower portion of each of the isolation trenches.

5. The semiconductor device of claim 1, wherein the gettering sites between the isolation trenches are laterally separated from each other.

6. The semiconductor device of claim 1, wherein a width relationship among the first cross-section, the second cross-section and the third cross-section satisfies following relations (1) and (2):

$$Wp1<Wp2 \quad (1)$$

$$Wp3<Wp2 \quad (2)$$

wherein Wp1 is a width of the first cross-section, Wp2 is a width of the second cross-section, and Wp3 is a width of the third cross-section.

7. The semiconductor device of claim 1, further comprising:

at least two upper through holes respectively disposed in the insulating layers; and an etching inhibitor covering an inner sidewall of each of the upper through holes.

8. The semiconductor device of claim 7, wherein a width relationship between each upper through hole and the third cross-section of each isolation trench satisfies following relation (3):

$$Wt1>Wp3 \quad (3)$$

wherein Wt1 is a width of each of the through holes.

9. The semiconductor device of claim 7, wherein a composition of the etching inhibitor comprises a polymer or a silicon-containing oxide.

10. The semiconductor device of claim 7, wherein the inner sidewall of the etching inhibitor is coincident with an upper inner sidewall of each of the isolation trenches.

11. The semiconductor device of claim 7, wherein the etching inhibitor comprises an inclined surface.

12. The semiconductor device of claim 7, further comprising at least two lower through holes disposed in the semiconductor layer, wherein the etching inhibitor further covers an inner sidewall of each of the lower through holes.

13. The semiconductor device of claim 1, wherein a surface of the semiconductor layer comprises at least two recessed regions, and the insulating layers are respectively filled in the recessed regions.

14. The semiconductor device of claim 1, further comprising an active device region disposed between the isolation trenches, and the active device region comprises a doped region vertically separated from the gettering sites.

15. A method of manufacturing a semiconductor device, comprising:

providing a substrate, wherein an insulating base layer and a semiconductor layer are sequentially disposed thereon;

forming an insulating layer on the semiconductor layer, wherein the insulating layer comprises a bottom surface;

forming at least one isolation trench in the semiconductor layer and the insulating layer to expose the insulating base layer, wherein forming the at least one isolation trench comprises:

etching the insulating layer to form an upper through hole in the insulating layer; and after etching the insulating layer, etching the semiconductor layer to form a lower through hole in the semiconductor layer, wherein a lower portion of the lower through hole comprises a tapered portion, and an etching inhibitor is concurrently formed during etching the semiconductor layer, and the etching inhibitor covers an inner sidewall of the upper through hole;

after forming the at least one isolation trench, forming a gettering site by using the insulating layer as an ion implantation mask, wherein the gettering site contacts the at least one isolation trench, and a vertex of the gettering site is lower than and vertically separated from a bottom surface of the insulating layer;

wherein the gettering site is configured to trap impurity atoms in the semiconductor layer so as to prevent the impurity atoms from negatively affecting an electrical performance of the semiconductor device, and a current is prevented from flowing through the gettering site; and forming an insulating material in the at least one isolation trench.

16. The method of claim 15, wherein the at least one isolation trench comprises a first cross-section, a second cross-section and a third cross-section from top to bottom, the first cross-section is higher than a bottom surface of each of the insulating layers, the second cross-section and the third cross-section are lower than the bottom surface of each of the insulating layers, and a width relationship among the first cross-section, the second cross-section and the third cross-section satisfies following relations (1) and (2):

$$Wp1<Wp2 \quad (1)$$

$$Wp3<Wp2 \quad (2)$$

wherein Wp1 is a width of the first cross-section, Wp2 is a width of the second cross-section, and Wp3 is a width of the third cross-section.

17. The method of claim 15, wherein a composition of the etching inhibitor comprises a polymer or a silicon-containing oxide.

18. The method of claim 15, wherein the etching inhibitor is gradually thickened during etching the semiconductor layer.

19. The method of claim 15, further comprising using the etching inhibitor as an ion implantation mask during forming the gettering site.

20. The method of claim 15, wherein the gettering site directly contacts the insulating base layer.

* * * * *